United States Patent [19]
Zibolski

[11] Patent Number: 5,168,233
[45] Date of Patent: Dec. 1, 1992

[54] ANTENNA JOINT FOR SURFACE COILS PROVIDED WITH A STRAIN RELIEF FLEXTURE JOINT

[75] Inventor: Richard E. Zibolski, Menomonee Falls, Wis.

[73] Assignee: General Electric Company, Milwaukee, Wis.

[21] Appl. No.: 582,740

[22] Filed: Sep. 14, 1990

[51] Int. Cl.⁵ .............................. G01R 33/20
[52] U.S. Cl. ............................. 324/322; 324/318; 439/620
[58] Field of Search ............... 324/318, 322; 439/620, 439/71; 128/653.3

[56] References Cited

U.S. PATENT DOCUMENTS

| | | | |
|---|---|---|---|
| 4,647,138 | 3/1987 | Muz | 439/620 |
| 4,682,125 | 7/1987 | Harrison et al. | 324/322 |
| 4,733,190 | 3/1988 | Dembinski | 324/318 |
| 4,772,225 | 9/1988 | Ulery | 439/620 |
| 4,783,641 | 11/1988 | Hayes et al. | 333/219 |
| 4,799,016 | 1/1989 | Rezvani | 324/318 |
| 4,837,515 | 6/1989 | Nishihara et al. | 324/322 |
| 4,846,701 | 7/1989 | Hayes et al. | 439/620 |
| 4,866,374 | 9/1989 | Cedrone | 439/620 |
| 4,897,604 | 1/1990 | Carlson et al. | 324/318 |
| 5,007,000 | 3/1991 | Masubuchi et al. | 439/620 |
| 5,046,968 | 9/1991 | Baur et al. | 439/620 |
| 5,073,117 | 12/1991 | Malhi et al. | 439/71 |
| 5,097,210 | 3/1992 | Requardt et al. | 324/322 |

Primary Examiner—Hezron E. Williams
Assistant Examiner—Howard Wisnia
Attorney, Agent, or Firm—Quarles & Brady

[57] ABSTRACT

An antenna joint for use in magnetic resonance reception wherein two portions of conductor or foil materials are secured to a splice plate. Electronic components are connected to the conductor materials over the splice plate which provides stress relief for the components. The splice plate can be of various geometric configurations and can have openings to accommodate the components.

13 Claims, 4 Drawing Sheets

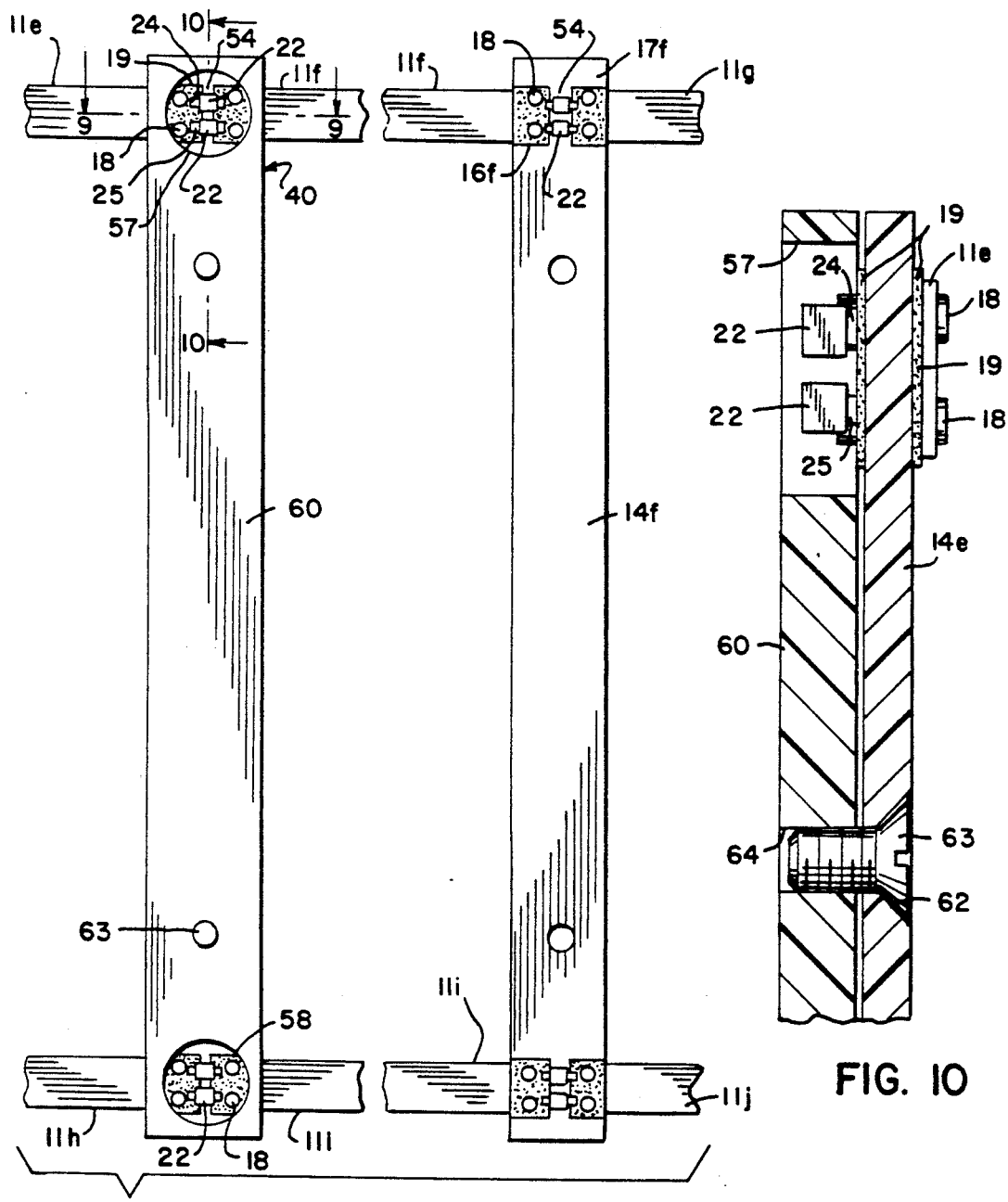
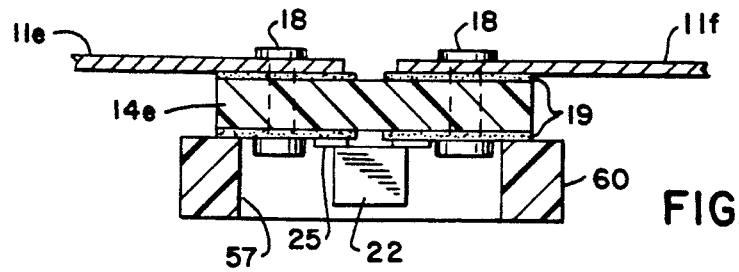
FIG. 8
FIG. 9
FIG. 10

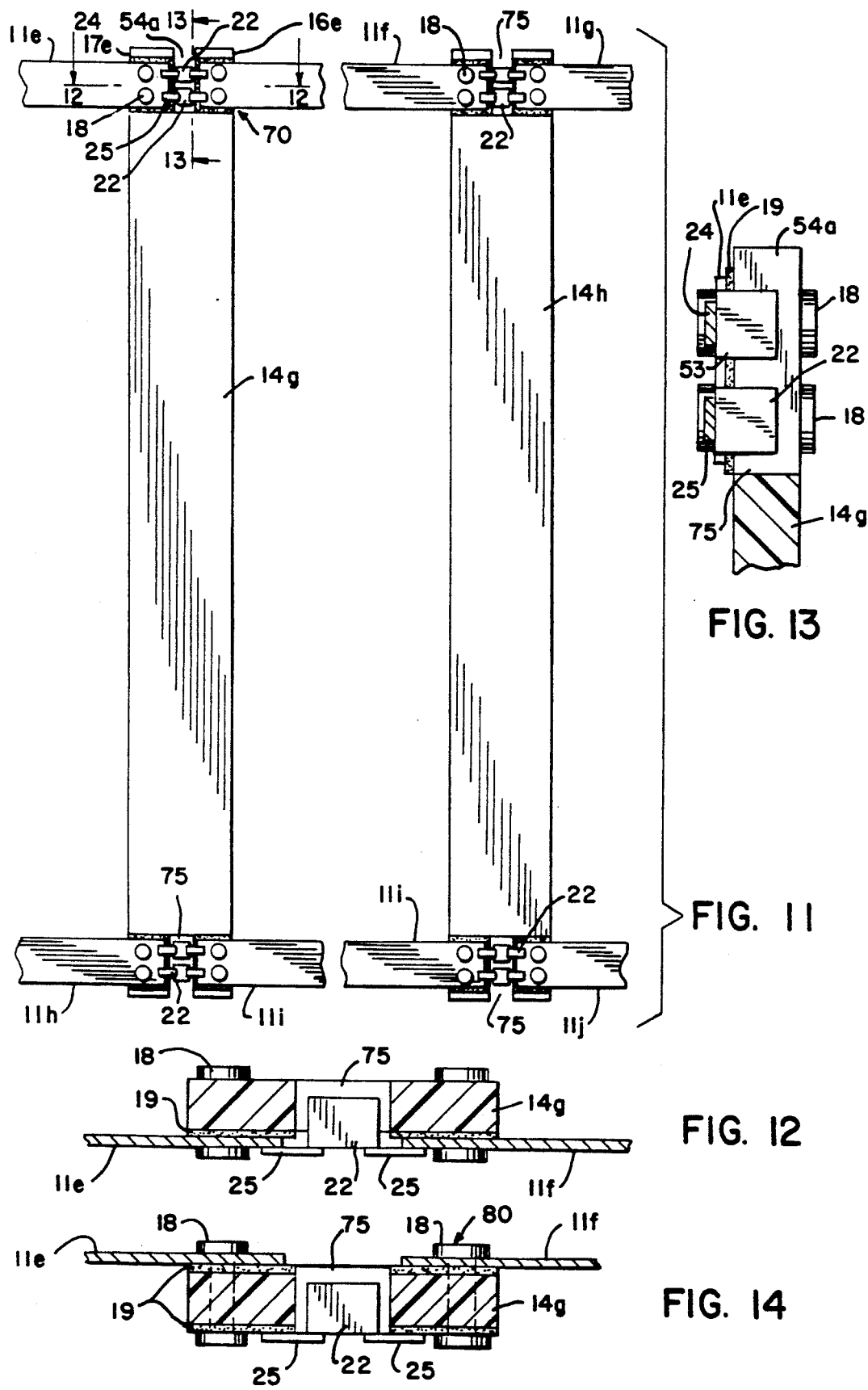

ANTENNA JOINT FOR SURFACE COILS PROVIDED WITH A STRAIN RELIEF FLEXTURE JOINT

BACKGROUND OF THE INVENTION

This invention relates to antennas used in conjunction with magnetic resonance (MR) diagnostic procedures. More particularly, it relates to an improved antenna joint design for the foil like antenna wherein the components are attached at an antenna joint in a manner so that they do not undergo bending stresses.

Foil type antennas are used in conjunction with MR procedures in order to pick up RF signals. In order to receive these signals efficiently, it is necessary that the antenna be of various configurations to fit over the parts of the body which are to be examined. Accordingly, they are commonly made from flat conductors which inherently have a relatively large surface area compared to the cross-sectional area in order to handle the surface currents associated with high frequency signals. In order for the antennas to perform at their best, it behooves them to be flexible.

The flexible antennae have RF components, such as capacitors, located at predetermined positions around the antenna. In many instances, the antennae are sections of copper foil with the components bridging the sections together. When the antenna coils are flexed during their usage, stresses occur in the components. Further, the gap between the coil sections is inherently a weak and critical area.

It is, therefore, an object of the present invention to provide an improved foil antenna for receiving RF signals.

It is another object of this invention to provide an antenna of the foregoing type wherein the stress factors on components placed on the antenna are reduced.

It is yet another object of this invention to provide an antenna of the foregoing type which can be made into several geometric configurations so as to conform to various parts of the body.

It is yet another object of the invention to provide an antenna of the foregoing type which can be produced from available materials without adding substantially to the cost thereof.

SUMMARY OF THE INVENTION

The above and other objects are achieved and the shortcomings of the prior art are overcome by the present antenna joint for magnetic resonance reception which includes a first conductor and a second separate conductor. A splice plate has sections for connecting the first and second conductors. An electronic component extends over a portion of the splice plate and is electrically connected to the first and second conductors.

In a preferred manner the splice plate includes an opening with the component placed therein.

In another preferred embodiment, the splice plate has two separate portions for connections with third and fourth conductors. A second electronic component is electrically connected to the third and fourth conductors. A cover member for the components is connected to the splice plate.

In yet another embodiment the electronic component is electrically connected to the first and second sections of conductive material by means of a strain relief flexture joint.

The foregoing and other objects and advantages of the invention will appear from the following description. In the description, reference is made to the accompanying drawing which forms a part thereof, and in which there is shown by way of illustration preferred embodiments of the invention. Such embodiments do not necessarily represent the full scope of the invention, however, and reference is therefore made to the claims herein for interpreting the scope of the invention.

BRIEF DESCRIPTION OF THE DRAWINGS

FIG. 8 is a top perspective view showing yet another alternative embodiment.

FIG. 9 is a view taken along line 9—9 of FIG. 8.

FIG. 10 is a view taken along line 10—10 of FIG. 8.

FIG. 11 is a view similar to FIG. 8 showing a further embodiment.

FIG. 12 is a view taken along line 12—12 of FIG. 11.

FIG. 13 is a view taken along line 13—13 of FIG. 11.

FIG. 14 is a view similar to FIG. 12 showing yet a further embodiment.

DETAILED DESCRIPTION OF THE INVENTION

Figure 1:
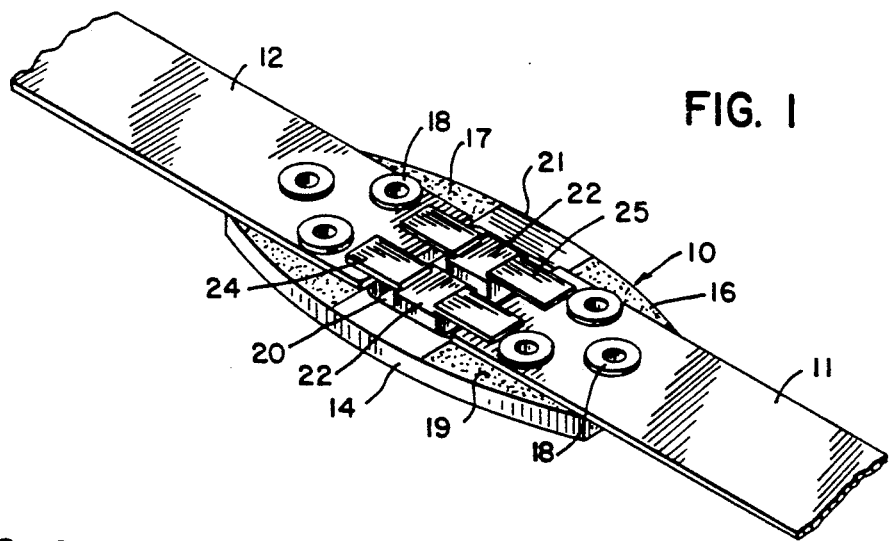
FIG. 1 is a top perspective view showing the antenna joint of this invention.
Figure 2:
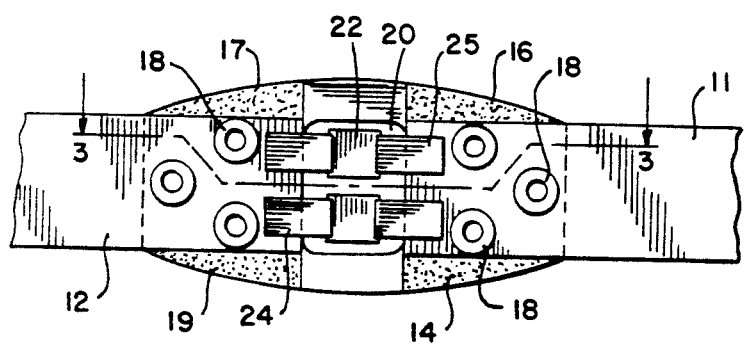
FIG. 2 is a top plan view of the antenna joint shown in FIG. 1.
Figure 3:
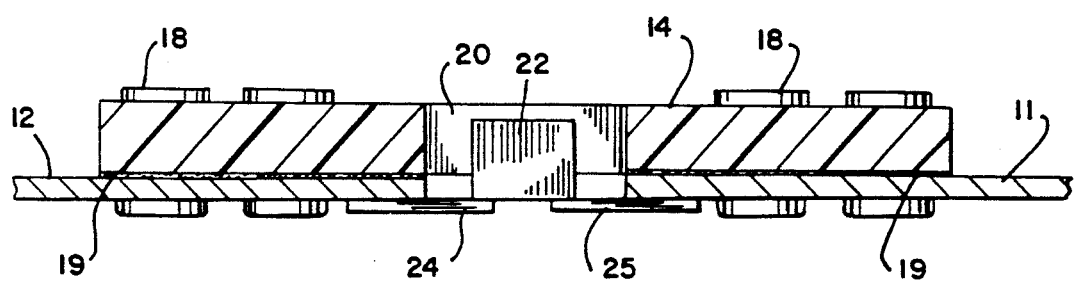
FIG. 3 is a view in vertical section taken along line 3—3 of FIG. 2.

Referring specifically to FIGS. 1-3, and the antenna joint generally 10, it has the usual conductors 11 and 12 which are composed of a preferred phosphorous bronze metal foil. These are connected to a splice plate 14 at the connection sections 16 and 17 which are clad with a metal conductor 19 such as copper. Rivets 18 provide the connection to the splice plate 14 which is composed of an insulator material such as plastic or fiberglass. It will be appreciated that the cladding material 19 could be eliminated as the rivets can supply the sufficient connection. Alternatively, rivets could be eliminated and the attachment relied upon by soldering the conductors 11 and 12 to the cladded connection section 16 and 17. It should be pointed out that where the cladding material is utilized, it does not cover the entire splice plate in order to avoid a shorting across the conductor materials 11 and 12. Its absence is indicated by the numeral 21.

Centrally positioned in the splice plate 14 is the window 20 which receives the electrical components 22 such as capacitors. The capacitors 22 are in turn electrically connected to the conductors 11 and 12 such as by the connectors 24 and 25.

In the following alternative embodiments, the same or similar components are indicated with the same number or a number followed by a letter. Different components have different numbers.

Figure 4:
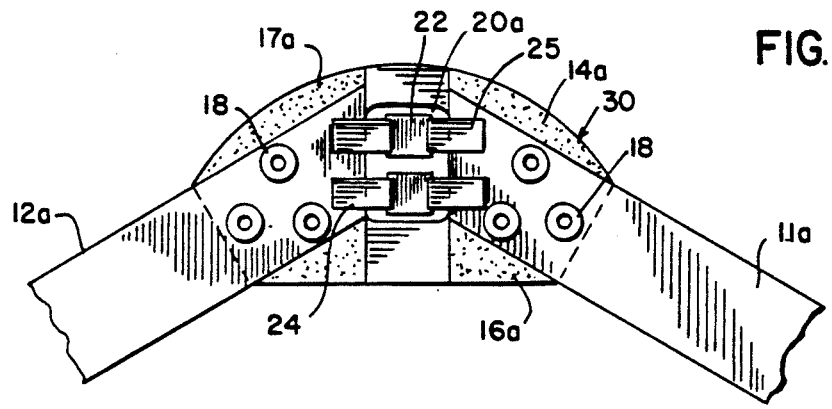
FIG. 4 is a view similar to FIG. 2 showing an alternative embodiment.

Referring to the alternative embodiment generally 30 in FIG. 4, it will be seen that it includes the same components as previously described in conjunction with FIGS. 1-3 except that the splice plate 14a presents a curved configuration so that the conductor materials 11a and 12a can be positioned at an angle with respect to each other. It will be appreciated that this angular relationship is important where the antenna must be presented in a curved manner with respect to the body.

Figure 5:
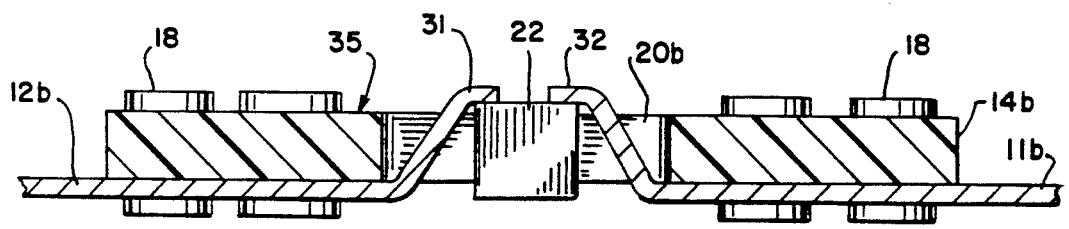
FIGS. 5-7 are views similar to FIG. 3 showing additional alternative embodiments.
Figure 6:
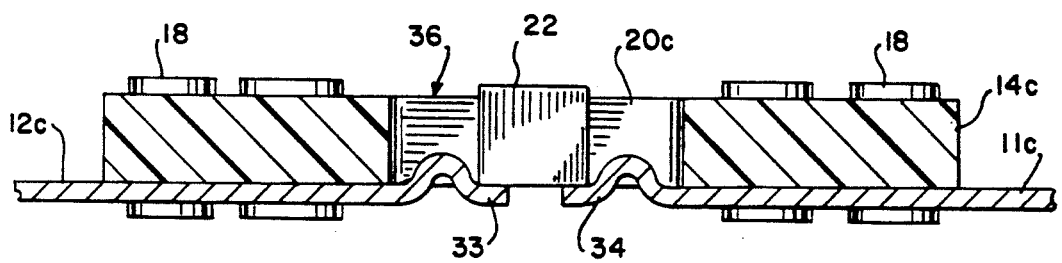
Figure 7:
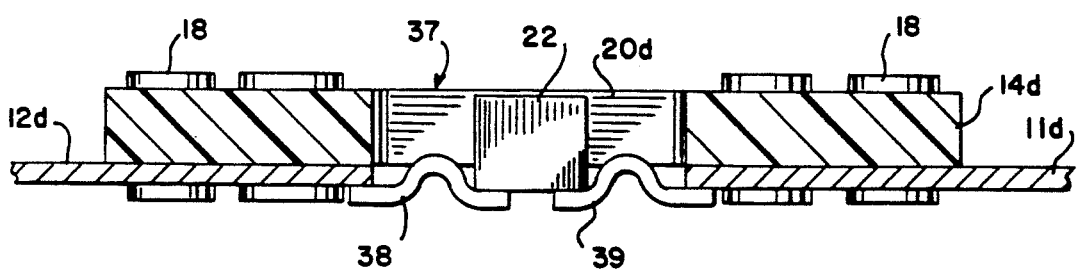

FIGS. 5-7 represent additional alternative embodiments generally 35, 36 and 37. These embodiments are presented to illustrate that the electrical components 22 can be connected to the conductors 11b-d and 12b-d with a flexture type joint. This is specifically shown in conjunction with embodiment 35 by the angular flexible connecting portions 31 and 32 which in effect are extensions of the conductors 11b and 12b.

With respect to embodiment 36 in FIG. 6 the flexible connections 33 and 34 have only a slight bend to them and thus connect to the same side of the component 22 which faces the conductor materials 11c and 12c. With respect to the embodiment 37 in FIG. 7, the configuration of the flexible connection 38 and 39 are similar to those of 33 and 34 except that they are not extensions of the conductors 11b and 12b but are separate connectors. In this instance they are connected to the conductive materials 11d and 12d such as by soldering and are independent of the rivets 18.

Another embodiment of an antenna joint is shown generally at 40 in FIGS. 8-10. This particular embodiment is constructed for a type of wrap around antenna on a body and thus would be in the form of a corset. It will include several conductors such as 11e-j which will be inner-connected through elongated splice plates 14e and 14f. The splice plates are connected to the conductors such as by the rivets 18. In this instance, the electrical components 22 are connected between the ends of the conductors 11e and 11f, 11f and 11g, 11h and 11i, and 11i and 11j, and by the connectors 24 and 25. A gap 54 between the ends of the conductors such as 11e and 11f is provided for this purpose. The splice plates 14e and 14f are etched and have a metal cladding 19 for better conductivity between the rivets 18 and the connectors 24 and 25 which are secured thereon. There is a cover 60 having a rectangular shape comparable to the splice plates 14e and 14f positioned over them in order to serve as a protective means for the components 22. The cover 60 has windows 57 and 58 for orientation over the components. The cover 60 is attached to the respective splice plate 14e by means of the screw 63 engaging the opening 62 in the splice plate 14e and engaging the threaded opening 64 in the cover 60.

A further embodiment is shown generally at 70 in FIGS. 11-13. This embodiment is somewhat similar to the previous embodiment 40 except that it does not have a cover member. Instead, the splice plates 14g and 14h have openings 75 in their end portions in which are placed the components 22. The conductors 11e-j are positioned on either side of the openings 75.

In FIG. 14 there is illustrated yet another embodiment generally 80. It is similar to embodiment 70 except the conductors such as 11e and 11f are connected to the splice plate 14g at a side opposite the connectors 24 and 25. Accordingly in this embodiment electrical current would be transferred from the conductors 11e and 11f through the rivets 18 to the opposite side of the splice plate 14g, over the cladding 19, through the connectors 25, 26 and to the component 22. In embodiment 70 and as best seen in FIG. 12, the current has a more direct path from the conductors 11e and 11f to the connectors 25.

In the previous embodiments the various components have been shown in either a window compartment or between an opening in a splice member. It should be appreciated that the splice joints can be left exposed to air or, if desired, and in order to protect the various components, they could be encapsulated in an insulated material such as a flexible plastic potting compound. An insulator such as tape, shrink tubing, a varnish or a flexible liquid coating could be employed as well as a molded housing. Further, the cover 60 could be eliminated from the embodiment 40 and the previously described encapsulating or insulating materials applied over the components and the connectors on the splice plates.

The splice plates as previously described can be made of various types of insulating materials. Plastic, bare fiberglass or fiberglass PWB material can be employed. They can also be made from a copper clad board material as long as the copper is removed in the center section to prevent shorting between the conductive materials. The cladding would allow for the conductors or coil foils to be soldered to the copper clad board to carry the stress of flexture and side-wise twist or the board can have eyelets to hold the coil foils to the splice plate. Another alternative would be to employ both eyeletting and soldering. In addition to soldering on the copper clad board, welding or brazing would be alternatives for the transfer of forces into the splice plate from the coil foils.

I claim:

1. An antenna joint for magnetic resonance reception comprising:
    a first conductor;
    a second conductor, said first and second conductors capable of receiving RF signals and being composed of a flexible material so as to fit over parts of a body to be examined;
    a splice plate having sections for connection to said first and second conductors; and
    an electric component extending over a portion of said splice plate and electrically connected to said first and second conductors;
    wherein said connection between said first and second conductors and said splice plate provides a strain relief flexture joint and said electronic component is electrically connected to said first and second conductors by means of said strain relief flexture joint and over said splice plate.

2. The antenna joint as defined in claim 1 wherein said splice plate includes an opening with said component placed therein.

3. The antenna joint as defined in claim 1 wherein said splice plate is mechanically fastened to said first and second conductors.

4. The antenna joint as defined in claim 1 wherein said splice plate has two separate portions for connection with third and fourth conductors; and
    a second electronic component electrically connected to said third and fourth conductors.

5. The antenna joint as defined in claim 4 further including a cover member for said components connected to said splice plate.

6. The antenna joint as defined in claim 4 wherein said splice plate includes two openings with said component placed in each of said openings.

7. The antenna joint as defined in claim 1 wherein said first and second conductors are connected to said splice plate in a linear manner.

8. The antenna joint as defined in claim 1 wherein said first and second conductors are connected to said splice plate in a curved manner.

9. The antenna joint as defined in claim 1 wherein said flexture joint is provided by an angled section in at least one of said first or second conductors.

10. The antenna joint as defined in claim 1 wherein said flexture joint is provided by a looped section in at least one of said first or second conductors.

11. The antenna joint as defined in claim 1 wherein said first and second conductors are connected to said splice plate by mechanical fastening and soldering, welding or brazing.

12. The antenna joint as defined in claim 1 wherein said conductors are connected to said electrical component by separate connectors.

13. The antenna joint as defined in claim 1 wherein said electronic component is enclosed in an insulating material.

* * * * *

UNITED STATES PATENT AND TRADEMARK OFFICE
CERTIFICATE OF CORRECTION

PATENT NO. : 5,168,233

DATED : December 1, 1992

INVENTOR(S) : Richard E. Zibolski

It is certified that error appears in the above-identified patent and that said Letters Patent is hereby corrected as shown below:

Column 4, line 39   "electric" should read --electronic--.

Signed and Sealed this

Nineteenth Day of October, 1993

Attest:

BRUCE LEHMAN

Attesting Officer    Commissioner of Patents and Trademarks